(12) United States Patent
Cao et al.

(10) Patent No.: US 11,250,237 B2
(45) Date of Patent: Feb. 15, 2022

(54) CIRCUIT FOR FINGERPRINT IDENTIFICATION AND DRIVING METHOD THEREOF, DISPLAY PANEL, AND DISPLAY DEVICE

(71) Applicant: BOE Technology Group Co., Ltd., Beijing (CN)

(72) Inventors: Xueyou Cao, Beijing (CN); Pengpeng Wang, Beijing (CN); Wenjuan Wang, Beijing (CN); Xiaoliang Ding, Beijing (CN); Haisheng Wang, Beijing (CN); Ping Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 7 days.

(21) Appl. No.: 16/861,576

(22) Filed: Apr. 29, 2020

(65) Prior Publication Data
US 2021/0097251 A1 Apr. 1, 2021

(30) Foreign Application Priority Data

Sep. 29, 2019 (CN) .......................... 201910936295.6

(51) Int. Cl.
*G06K 9/00* (2006.01)
*H03K 17/687* (2006.01)

(52) U.S. Cl.
CPC ....... *G06K 9/0004* (2013.01); *H03K 17/6871* (2013.01)

(58) Field of Classification Search
CPC .......................... G06K 9/0004; H03K 17/687
See application file for complete search history.

(56) References Cited

U.S. PATENT DOCUMENTS

| 2010/0097354 A1* | 4/2010 | Ahn | G06F 3/0412 345/175 |
| 2013/0162602 A1* | 6/2013 | Nakagawa | H01L 27/14601 345/175 |
| 2017/0131143 A1* | 5/2017 | Andreou | H01L 31/02027 |
| 2021/0174051 A1* | 6/2021 | Wang | G06K 9/0004 |

* cited by examiner

*Primary Examiner* — Lixi C Simpson
(74) *Attorney, Agent, or Firm* — Arent Fox LLP; Michael Fainberg

(57) ABSTRACT

The present disclosure relates to a circuit for fingerprint identification and a driving method thereof, a display panel, and a display device. The circuit for fingerprint identification of the present disclosure includes a voltage adjustment circuit, a photodiode, and a signal output circuit; wherein the voltage adjustment circuit is electrically connected with an anode of the photodiode, and the signal output circuit is electrically connected with a cathode of the photodiode; the voltage adjustment circuit is configured to adjust an anode voltage input to the photodiode to enable the photodiode to work in a linear region; and the signal output circuit is configured to amplify and output a signal output by the photodiode.

15 Claims, 5 Drawing Sheets

-- Prior Art --

CIRCUIT FOR FINGERPRINT IDENTIFICATION AND DRIVING METHOD THEREOF, DISPLAY PANEL, AND DISPLAY DEVICE

The present application claims priority to Chinese Patent Application No. 201910936295.6 filed with the Chinese Patent Office on Sep. 29, 2019, which is hereby incorporated by reference in its entirety.

FIELD

The present disclosure relates to the technical field of displaying, and particularly relates to a circuit for fingerprint identification and a driving method thereof, a driving panel, and a display device.

BACKGROUND

An optical fingerprint identification technology has become a mature fingerprint identification technology and has been widely used in daily lives of people, such as a fingerprint lock and a fingerprint attendance machine.

At the present, the basic device structure for optical fingerprint identification, as shown in FIG. 1, includes a photodiode (PIN), a switching transistor T, and a signal amplification and output circuit (including a capacitor C and an amplifier U). Technical verification shows that this circuit structure can achieve optical fingerprint identification.

SUMMARY

The circuit for fingerprint identification provided by the embodiment of the present disclosure includes:
a voltage adjustment circuit,
a photodiode, and
a signal output circuit;
wherein the voltage adjustment circuit is electrically connected with an anode of the photodiode, and the signal output circuit is electrically connected with a cathode of the photodiode;
the voltage adjustment circuit is configured to adjust an anode voltage input to the photodiode to enable the photodiode to work in a linear region; and
the signal output circuit is configured to amplify and output a signal output by the photodiode.

Optionally, during specific implementation, in the foregoing circuit for fingerprint identification provided by the embodiment of the present disclosure, the voltage adjustment circuit includes:
a first transistor and a constant current source, wherein the first transistor works in an amplifier region, and a current value of the constant current source is adjustable;
a gate of the first transistor is connected with a reset signal terminal; a first electrode of the first transistor is connected with a first power terminal; a second electrode of the first transistor is connected with a first end of the constant current source and the anode of the photodiode; and a second end of the constant current source is connected with a second power terminal.

Optionally, during specific implementation, in the foregoing circuit for fingerprint identification provided by the embodiment of the present disclosure, the voltage adjustment circuit further includes:
a second switching transistor and a third switching transistor;
wherein a gate of the second switching transistor is connected with a first control signal terminal; a first electrode of the second switching transistor is connected between the first end of the constant current source and the second electrode of the first transistor; a second electrode of the second switching transistor is connected with the anode of the photodiode; and
a gate of the third switching transistor is connected with a second control signal terminal; a first electrode of the third switching transistor is connected with a third power terminal; and a second electrode of the third switching transistor is connected with the anode of the photodiode.

Optionally, during specific implementation, in the foregoing circuit for fingerprint identification provided by the embodiment of the present disclosure, the voltage adjustment circuit further includes:
a fourth switching transistor; wherein
a gate of the fourth switching transistor is connected with a third control signal terminal;
a first electrode of the fourth switching transistor is connected with the reset signal terminal; and
a second electrode of the fourth switching transistor is connected with the gate of the first transistor.

Optionally, during specific implementation, in the foregoing circuit for fingerprint identification provided by the embodiment of the present disclosure, the first control signal terminal and the third control signal terminal are the same signal terminal.

Optionally, during specific implementation, in the foregoing circuit for fingerprint identification provided by the embodiment of the present disclosure, the signal output module includes:
a fifth switching transistor,
an amplifier, and
a capacitor;
wherein a gate of the fifth switching transistor is connected with a fourth control signal terminal; a first electrode of the fifth switching transistor is connected with the cathode of the photodiode; the second electrode of the fifth switching transistor is connected with a negative input terminal of the amplifier; a positive input terminal of the amplifier is connected with a reference voltage terminal; and the capacitor is connected between the negative input terminal of the amplifier and the output terminal of the amplifier.

Correspondingly, the embodiment of the present disclosure further provides a display device, including a display panel. The display panel includes any one of the foregoing circuits for fingerprint identification provided by the embodiments of the present disclosure.

Correspondingly, the embodiment of the present disclosure further provides a driving method of any one of the foregoing circuits for fingerprint identification provided by the embodiments of the present disclosure. The driving method includes:
during fingerprint identification, loading an initial voltage to the anode of the photodiode through the voltage adjustment circuit;
reading a data signal output by the signal output module circuit according to the initial voltage;
comparing the data signal output by the signal output circuit with a pre-stored threshold range; and
determining whether the data signal output by the signal output circuit is within the threshold range;
if YES, performing the fingerprint identification directly according to the data signal output by the signal output circuit; and if NO, adjusting the anode voltage input to the photodiode through the voltage adjustment circuit to enable the photodiode to work in the linear region, and performing the fingerprint identification on a output data signal collected by the photodiode, when the photodiode works in the linear region.

Optionally, during specific implementation, in the foregoing driving method provided by the embodiment of the present disclosure, the loading the initial voltage to the anode of the photodiode through the voltage adjustment circuit includes:

loading an initial current value to the constant current source, and loading the initial voltage to the anode of the photodiode through the second electrode of the first transistor.

Optionally, during specific implementation, in the foregoing driving method provided by the embodiment of the present disclosure, the adjusting the anode voltage input to the photodiode through the voltage adjustment circuit includes:

on the basis of the initial current value, increasing the current value of the constant current source to reduce the anode voltage of the photodiode;

collecting a data signal output by the signal output circuit;

determining whether the data signal is within the threshold range, and adjusting the current value of the constant current source until the data signal output by the signal output circuit is within the threshold range.

Optionally, during specific implementation, in the foregoing driving method provided by the embodiment of the present disclosure, when the voltage adjustment circuit further includes a second switching transistor and a third switching transistor, the loading the initial voltage to the anode of the photodiode through the voltage adjustment circuit includes:

switching off the second switching transistor, switching on the third switching transistor, and loading the initial voltage to the anode of the photodiode through a third power terminal.

Optionally, during specific implementation, in the foregoing driving method provided by the embodiment of the present disclosure, the adjusting the anode voltage input to the photodiode through the voltage adjustment circuit includes:

switching off the third switching transistor, switching on the second switching transistor;

loading a set current value to the constant current source;

loading a first voltage to the anode of the photodiode through the second electrode of the first transistor, wherein the first voltage is less than the initial voltage;

collecting a data signal output by the signal output circuit;

determining whether the data signal is within the threshold range; and adjusting the set current value of the constant current source until the data signal output by the signal output circuit is within the threshold range.

DETAILED DESCRIPTION OF THE EMBODIMENTS

In order to make the objectives, technical solutions and advantages of the present disclosure clearer, specific implementation modes of a circuit for fingerprint identification and a driving method thereof, a display panel, and a display device, which are provided by the embodiments of the present disclosure, are described in detail below in conjunction with the accompanying drawings. It should be understood that the preferred embodiments described below are merely to illustrate and explain the present disclosure, and not intended to limit the present disclosure. Furthermore, the embodiments in this application and features in the embodiments may be combined with each other without conflicts.

When it comes to optical fingerprint recognition, there is a very big problem in related art. That is, if the sunlight is relatively strong in summer or at noon, or the external ambient light is relatively strong, the PIN tends to be saturated. At this time, a response of the PIN to light is not in a linear region range. Therefore, there will be a very small valley-ridge difference of a fingerprint. As a result, fingerprint valley and ridge information collected by the signal amplification and output circuit is not clear and has an insufficient contrast ratio, so that no valid fingerprint can be collected.

Figure 1:
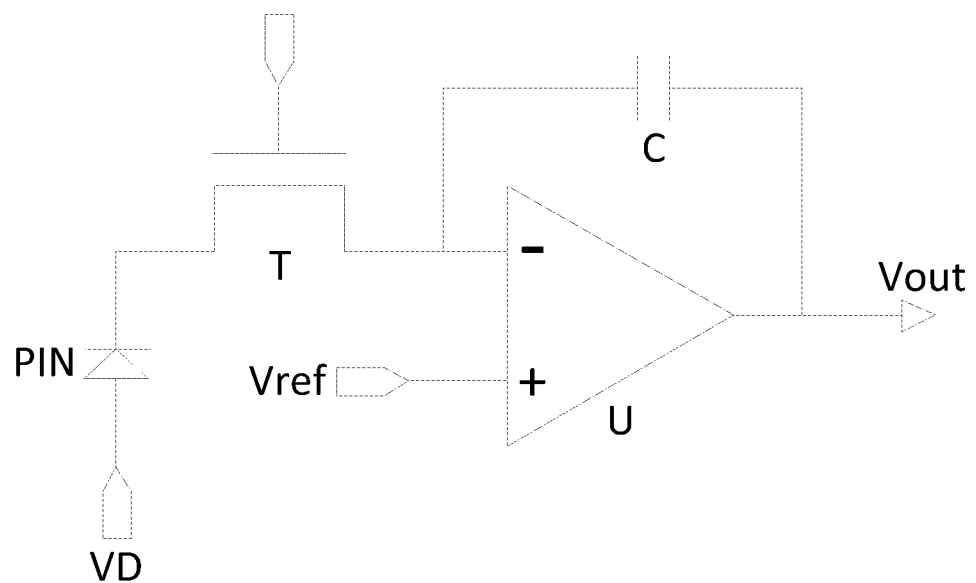
FIG. 1 is a schematic structural diagram of a circuit for existing fingerprint identification in related art.
Figure 2:
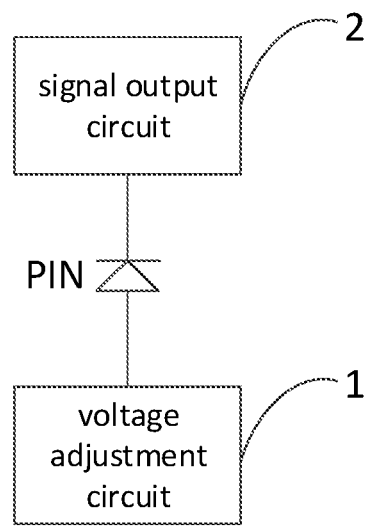
FIG. 2 is a first structural schematic diagram of a circuit for fingerprint identification provided by the embodiment of the present disclosure.

Therefore, a circuit for fingerprint identification provided by the embodiment of the present disclosure, as shown in FIG. 2, includes: a voltage adjustment circuit 1, a photodiode PIN, and a signal output circuit 2.

The voltage adjustment circuit 1 is electrically connected with an anode of the photodiode PIN, and the signal output circuit 2 is electrically connected with a cathode of the photodiode PIN.

The voltage adjustment circuit 1 is configured to adjust an anode voltage input to the photodiode PIN to enable the photodiode PIN to work in a linear region.

The signal output circuit 2 is configured to amplify and output a signal output by the photodiode PIN.

The foregoing circuit for fingerprint identification provided by the embodiment of the present disclosure can adjust the anode voltage input to the photodiode through the added voltage adjustment circuit to enable the photodiode to work in the linear region. For example, in case of relatively strong external light, the photodiode is in a saturated state. At this time, the anode voltage input to the photodiode is adjusted through the voltage adjustment circuit to enable the photodiode to work in the linear region. In this way, the linear region range of the photodiode can be enlarged. That is, the photodiode working area is changed from a saturated region to the linear region to have a larger dynamic range, thereby realizing valid fingerprint identification under strong ambient light.

It should be noted that the photodiode uses the reversal of biasing characteristic, i.e., uses the anode to input a negative voltage and uses the cathode to input a positive voltage.

Figure 3:
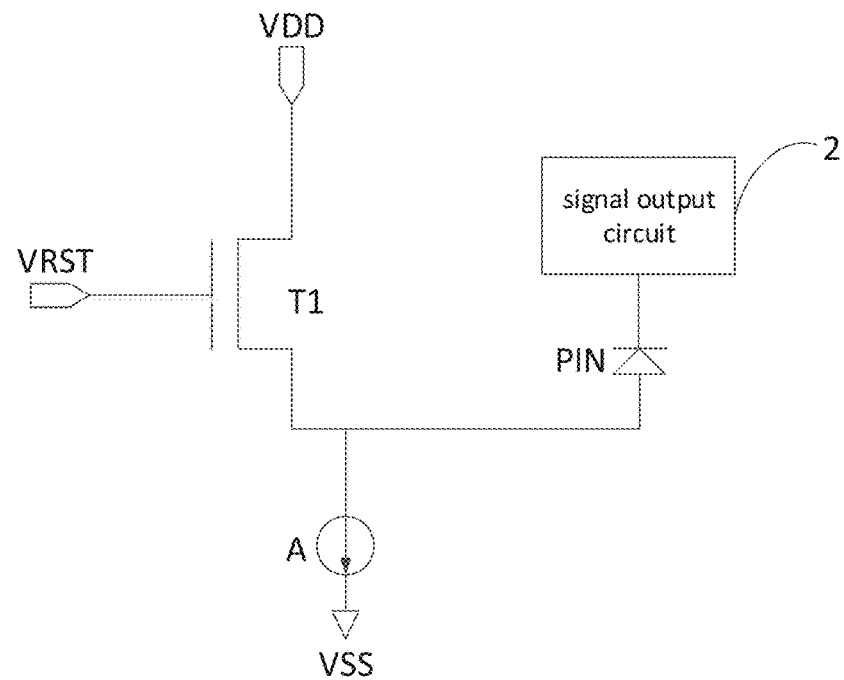
FIG. 3 is a second structural schematic diagram of the circuit for fingerprint identification provided by the embodiment of the present disclosure.

Optionally, in the foregoing circuit for fingerprint identification provided by the embodiment of the present disclosure, as shown in FIG. 3, the voltage adjustment circuit 1 may include: a first transistor T1 and a constant current source A. The first transistor T1 works in an amplifier region, and a current value of the constant current source A is adjustable.

The gate of the first transistor T1 is connected with a reset signal terminal VRST. The first electrode of the first transistor T1 is connected with a first power terminal VDD. The second electrode of the first transistor T1 is connected with the first end of the constant current source A and the anode of the photodiode PIN, respectively.

The second end of the constant current source A is connected with a second power terminal VSS.

As shown in FIG. 3, if the first transistor T1 works in the amplifier region through a signal of the reset signal terminal VRST, current flowing through the first transistor T1 is the current of the constant current source A. It is assumed that a cathode voltage of the photodiode PIN is fixed (such as 5 V), VDD is fixed, and $R_{T1}$ which is the resistance of the first transistor T1 is fixed. During fingerprint identification performed under relatively weak ambient light or in a room, the anode voltage is −4 V, and the photodiode PIN works in the linear region. Since the first transistor T1 works in the amplifier region, the voltage output by the second electrode of the first transistor T1 is the anode voltage flowing into the photodiode PIN, which is $VDD-I_A*R_{T1}$, wherein $I_A$ is a current value of the constant current source A, and $R_{T1}$ is the resistance of the first transistor T1. Therefore, during the fingerprint identification performed under the relatively weak ambient light or in the room, the voltage value of $VDD-I_A*R_{T1}$ may be −4 V by reasonably setting the current value $I_A$ of the constant current source A, thereby realizing a function of performing the fingerprint identification under the relatively weak ambient light or in the room. During fingerprint identification performed under strong ambient light, the photodiode PIN works in a saturated region, that is, a response of the photodiode PIN to the light is not within a linear region range, so that there will be a very small fingerprint valley-ridge difference. As a result, fingerprint valley and ridge information collected by the signal output circuit is not clear and has an insufficient contrast ratio, so that no valid fingerprint can be collected under a strong light environment. Since the linear region range of the photodiode PIN is related to a voltage difference between the cathode and the anode of the photodiode PIN, if the voltage difference is larger, the linear region range is larger. Therefore, the voltage difference between the cathode and the anode of the photodiode PIN needs to be increased on the basis of the fingerprint identification performed under the relatively weak ambient light or in the room. Since the cathode voltage is fixed (such as 5V), the anode voltage needs to be reduced. That is, since VDD is fixed, and $R_{T1}$ is fixed, in order to make the voltage value of $VDD-I_A*R_{T1}$ less than −4V, the current value $I_A$ of the constant current source A can be adjusted. Specifically, the voltage value of $VDD-I_A*R_{T1}$ may be set according to an actual requirement. Therefore, the voltage adjustment circuit 1 in the embodiment of the present disclosure may enlarge the linear region range of the photodiode PIN. That is, under a strong light environment, the photodiode PIN working area may be changed from the saturated region to the linear region, so that the PIN may have a larger dynamic range to realize valid fingerprint identification under the strong ambient light.

It should be noted that the current of the constant current source is generally adjusted through an external circuit.

Figure 4:
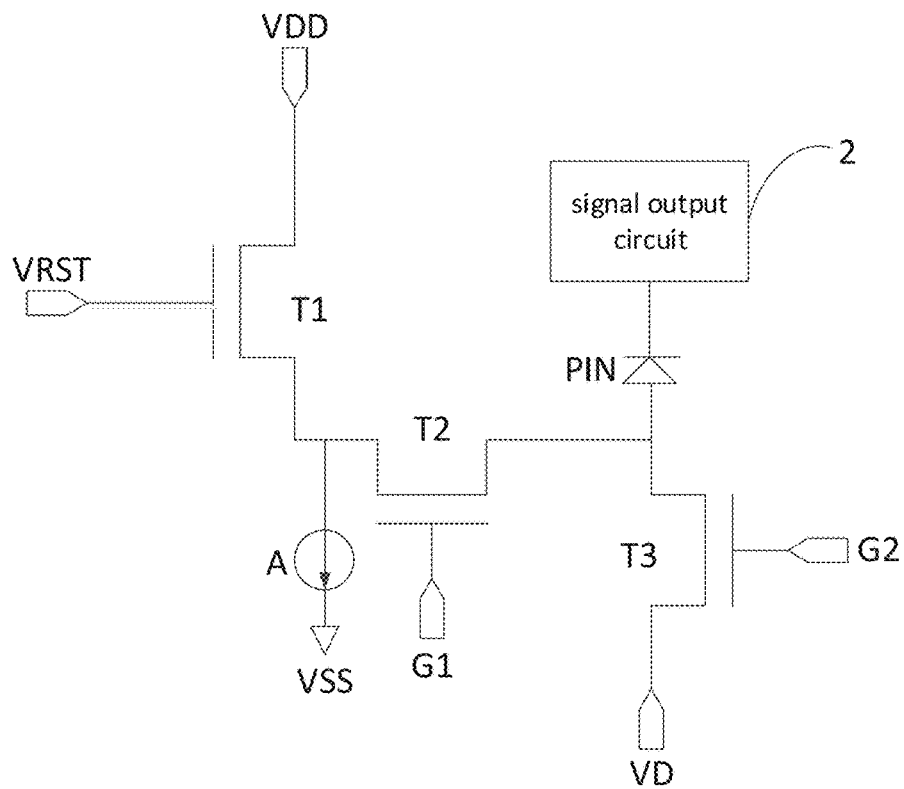
FIG. 4 is a third structural schematic diagram of the circuit for fingerprint identification provided by the embodiment of the present disclosure.

Optionally, in the foregoing circuit for fingerprint identification provided by the embodiment of the present disclosure, as shown in FIG. 4, the voltage adjustment circuit 1 may further include: a second switching transistor T2 and a third switching transistor T3.

The gate of the second switching transistor T2 is connected with a first control signal terminal G1. The first electrode of the second switching transistor T2 is connected between the first end of the constant current source A and the second electrode of the first transistor T1. The second electrode of the second switching transistor T2 is connected with the anode of the photodiode PIN.

The gate of the third switching transistor T3 is connected with a second control signal terminal G2. The first electrode of the third switching transistor T3 is connected with a third power terminal VD. The second electrode of the third switching transistor T3 is connected with the anode of the photodiode PIN.

As shown in FIG. 4, during fingerprint identification performed under relatively weak ambient light or in a room, the second switching transistor T2 is switched off under the control of the first control signal terminal G1, and the third switching transistor T3 is switched on under the control of the second control signal terminal G2. An anode voltage that may enable the photodiode PIN to work in the linear region is input to the anode of the photodiode PIN through the third power terminal VD. During fingerprint identification performed under strong ambient light, the third switching transistor T3 is switched off under the control of the second control signal terminal G2, and the second switching transistor T2 is switched on under the control of the first control signal terminal G1. The specific working principle of adjusting the current value $I_A$ of the constant current source A refers to the illustration of the above FIG. 3, and repeated content is not described here.

Figure 5:
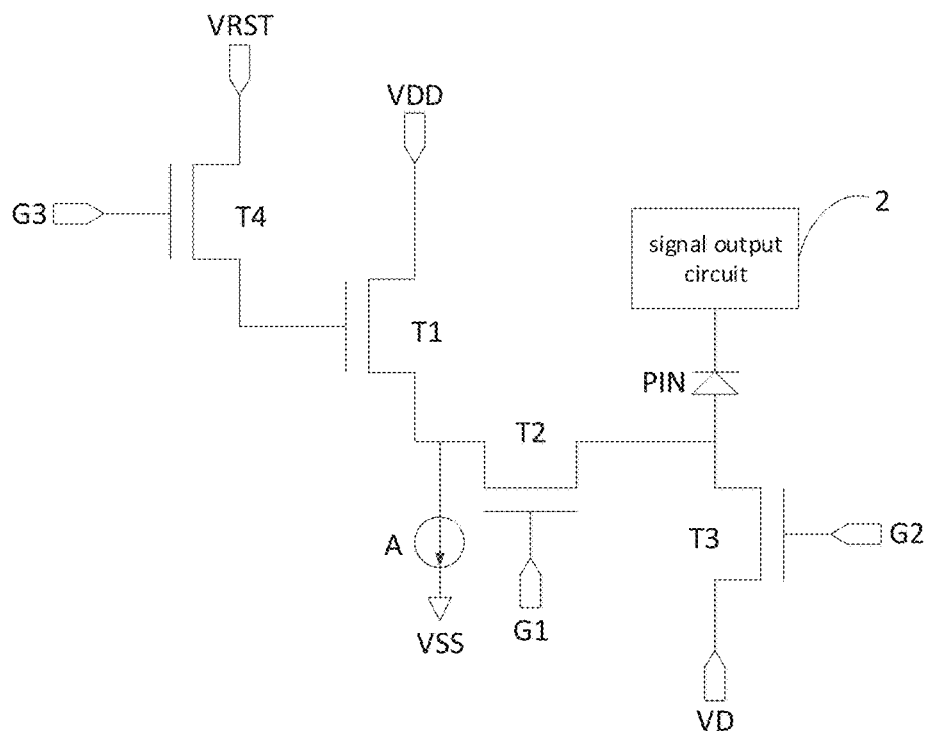
FIG. 5 is a fourth structural schematic diagram of the circuit for fingerprint identification provided by the embodiment of the present disclosure.

Optionally, in the foregoing circuit for fingerprint identification provided by the embodiment of the present disclosure, as shown in FIG. 5, the voltage adjustment circuit 1 may further include: a fourth switching transistor T4.

The gate of the fourth switching transistor T4 is connected with a third control signal terminal G3. The first electrode of the fourth switching transistor T4 is connected with the reset signal terminal VRST. The second electrode of the fourth switching transistor T4 is connected with the gate of the first transistor T1.

As shown in FIG. 5, during fingerprint identification performed under strong ambient light, the fourth switching transistor T4 is switched on under the control of the third control signal terminal G3, and a signal of the reset signal terminal VRST is input to the gate of the first transistor T1 through the fourth switching transistor T4. That is, the first transistor T1 is in an on state all the time under the strong ambient light, and the voltage of the first power terminal VDD is input to the first electrode of the first transistor T1, since the first transistor T1 is a source follower, the voltage value output by the second electrode of the first transistor T1 is $VDD-I_A*R_{T1}$.

Optionally, in the foregoing circuit for fingerprint identification provided by the embodiment of the present disclosure, as shown in FIG. 5, the second switching transistor T2 and the fourth switching transistor T4 are simultaneously switched on and simultaneously switched off, so that the first control signal terminal G1 and the third control signal terminal G3 may be the same signal terminal in order to reduce the layout of signal lines.

Figure 6:
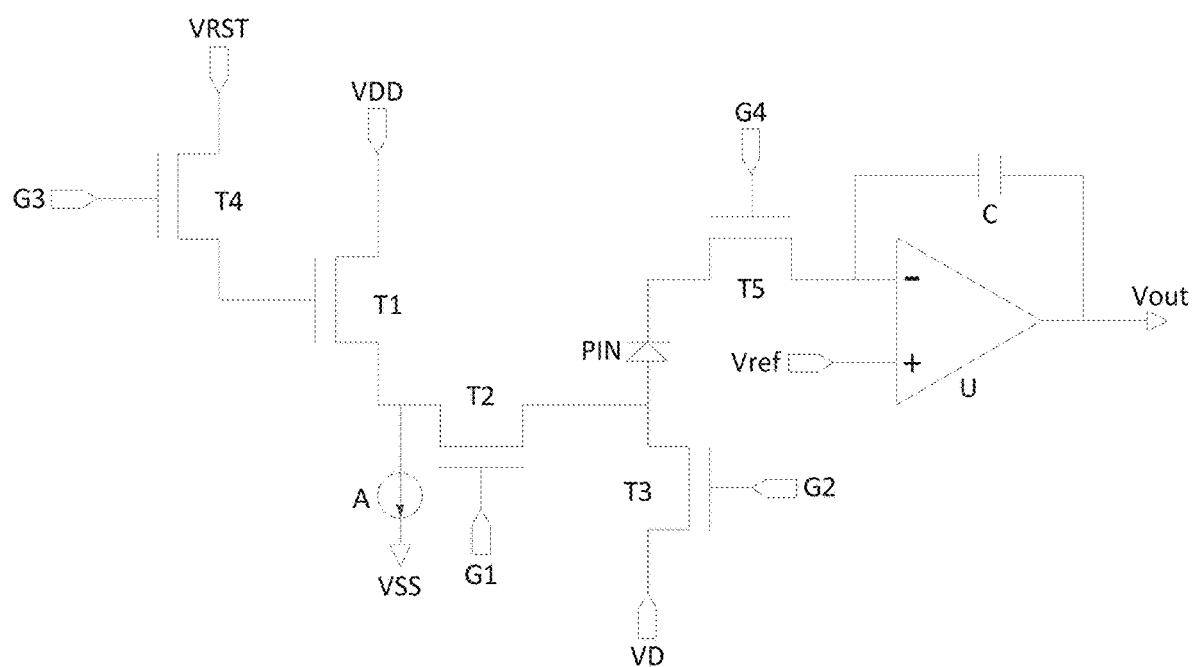
FIG. 6 is a fifth structural schematic diagram of the circuit for fingerprint identification provided by the embodiment of the present disclosure.

Optionally, in the foregoing circuit for fingerprint identification provided by the embodiment of the present disclosure, as shown in FIG. 6, the signal output circuit 2 may include: a fifth switching transistor T5, a capacitor C, and an amplifier U.

The gate of the fifth switching transistor T5 is connected with a fourth control signal terminal G4. The first electrode of the fifth switching transistor T5 is connected with the cathode of the photodiode PIN. The second electrode of the fifth switching transistor T5 is connected with the negative input terminal − of the amplifier U. The positive input terminal + of the amplifier U is connected with a reference voltage terminal Vref. The capacitor C is connected between the negative input terminal − and the output terminal Vout of the amplifier U.

As shown in FIG. 6, during the fingerprint identification, if the fingerprint identification is performed under the relatively weak ambient light or in the room, three stages, i.e., reset, integration and collection, are included. At the reset stage: the fifth switching transistor T5 is switched on under the control of the fourth control signal terminal G4, a signal of the reference voltage terminal Vref is input to the cathode of the photodiode PIN through the amplifier U, and the cathode voltage is provided for the cathode of the photodiode PIN; the second switching transistor T2 is switched off under the control of the first control signal terminal G1, the third switching transistor T3 is switched on under the control of the second control signal terminal G2 and the anode voltage that may enable the photodiode PIN to work in the linear region is input to the anode of the photodiode PIN through the third power terminal VD. At the integration stage: the fifth switching transistor T5 is switched off under the control of the fourth control signal terminal G4. At this stage, the fifth switching transistor T5 is in an off state to accumulate a current signal of light in the photodiode PIN, so that a relatively strong light current signal is input into a storage capacitor to improve the accuracy of fingerprint identification. At the collection stage: the fifth switching transistor T5 is switched on under the control of the fourth control signal terminal G4, and the light current signal accumulated in the photodiode PIN is input into the storage capacitor C, then amplified through the amplifier U and output through the signal output terminal Vout, so as to perform the fingerprint identification. During fingerprint identification performed under the strong ambient light, a difference from the fingerprint identification performed under the relatively weak ambient light or in the room is that: the third switching transistor T3 is switched off, and the second switching transistor T2 and the fourth switching transistor T4 are switched on. The anode voltage input to the photodiode PIN is adjusted by adjusting the current value of the constant current source A, which is to enable the photodiode PIN to work in the linear region. The difference also includes the above reset, integration and collection stages, and repeated content is not described here.

It should be noted that in the foregoing circuit for fingerprint identification provided by the embodiment of the present disclosure, the transistor and the switching transistors may be Thin Film Transistors (TFTs), or Metal Oxide Semiconductor (MOS) field-effect transistors, and are not limited herein.

Optionally, the functions of the first electrodes and the second electrodes of these transistors may be interchanged according to different types of transistors and different signals of the signal terminals. The first electrodes may be sources, and the second electrodes may be drains, or the first electrodes may be drains, and the second electrodes may be sources. No specific distinctions are made here.

Figure 7:
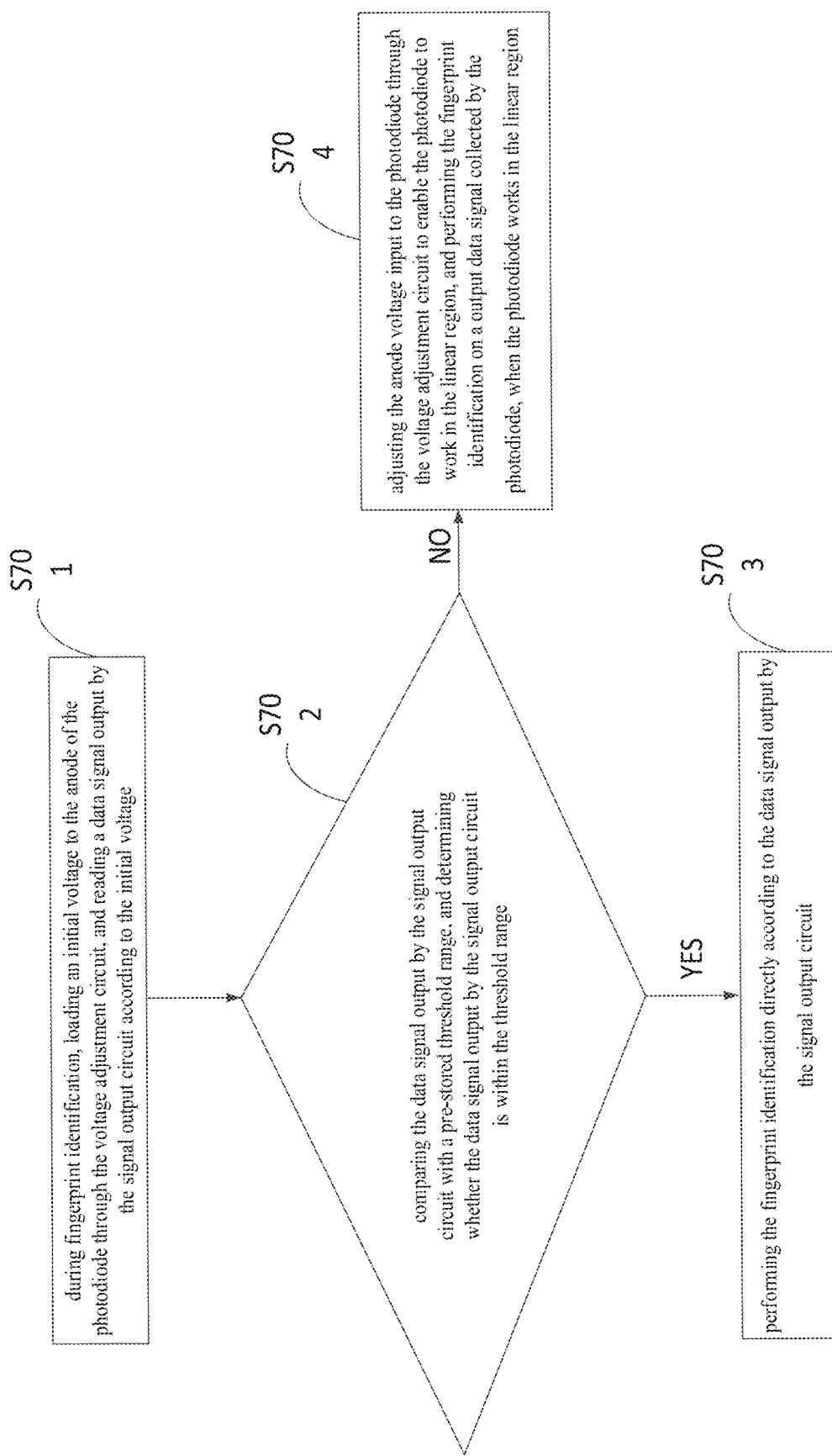
FIG. 7 is a flow diagram of a driving method of a circuit for fingerprint identification provided by the embodiment of the present disclosure.

Based on the same inventive concept, the embodiment of the present disclosure further provides a driving method of any one of the foregoing circuits for fingerprint identification provided by the embodiments of the present disclosure. As shown in FIG. 7, the driving method may specifically include the following steps:

S701, during fingerprint identification, loading an initial voltage to the anode of the photodiode through the voltage adjustment circuit, and reading a data signal output by the signal output circuit according to the initial voltage;

S702, comparing the data signal output by the signal output circuit with a pre-stored threshold range, and determining whether the data signal output by the signal output circuit is within the threshold range;

if YES, performing S703, i.e. performing the fingerprint identification directly according to the data signal output by the signal output circuit; and if NO, performing S704, i.e. adjusting the anode voltage input to the photodiode through the voltage adjustment circuit to enable the photodiode to work in the linear region, and performing the fingerprint identification on a output data signal collected by the photodiode, when the photodiode works in the linear region.

According to the foregoing driving method of the fingerprint identification circuit, which is provided by the embodiment of the present disclosure, firstly, the initial voltage that may perform the fingerprint identification under relatively weak external light or in a room is loaded to the anode of the photodiode through the voltage adjustment circuit, and the data signal output by the signal output circuit at this time is collected; whether the data signal is within the pre-stored threshold range is determined; if YES, it is indicated that the photodiode works in the linear region, and the fingerprint identification is performed directly according to the data signal output by the signal output circuit; and if NO, the anode voltage input to the photodiode is adjusted through the voltage adjustment circuit to enable the photodiode to work in the linear region, and the fingerprint identification is performed on the collected output data signal when the photodiode works in the linear region. That is, the present disclosure may implements through the driving method that when the photodiode is in a saturated state in case of relatively strong external light, the anode voltage input to the photodiode is adjusted through the voltage adjustment circuit to enable the photodiode to work in the linear region. In this way, the linear region range of the photodiode can be enlarged. That is, the photodiode working area is changed from a saturated region to the linear region to have a larger dynamic range, thereby realizing valid fingerprint identification under strong ambient light.

Optionally, in the foregoing circuit for fingerprint identification provided by the embodiment of the present disclosure, as shown in FIG. 3, the step that the initial voltage $V_0$ is loaded to the anode of the photodiode PIN through the voltage adjustment circuit 1 may include that:

loading an initial current value $I_0$ to the constant current source A, and loading the initial voltage $V_0$ to the anode of the photodiode PIN through the second electrode of the first transistor T1, at this time, $V_O=VDD-I_0*R_{T1}$, and the $V_O$ can be controlled specifically to −4 V.

It should be noted that the initial voltage loaded to the anode of the photodiode PIN is a voltage value during the fingerprint identification performed under the relatively weak external light or in the room, and the initial current value of the constant current source A can be calculated according to the initial voltage value.

Optionally, in the foregoing circuit for fingerprint identification provided by the embodiment of the present disclosure, as shown in FIG. 3, the step that when the data signal output by the signal output circuit 2 is not within the threshold range, the anode voltage input to the photodiode PIN is adjusted through the voltage adjustment circuit 1 may include that:

on the basis of the initial current value $I_0$, increasing the current value of the constant current source A to reduce the anode voltage V of the photodiode PIN, wherein $V=VDD-I_A*R_{T1}$; since VDD is more than 0, and $R_{T1}$ is more than 0, V is reduced by increasing $I_A$; therefore, the anode voltage V of the photodiode PIN may be reduced by increasing the current value of the constant current source A, so that a voltage difference between the anode and the cathode of the photodiode PIN can be increased, thereby enlarging the linear region range of the photodiode PIN; and collecting a data signal output by the signal output circuit 1 again, determining whether the data signal is within the threshold range, and adjusting the current value of the constant current source until the data signal output by the signal output circuit is within the threshold range. After the reduced anode voltage V is input to the anode of the photodiode PIN, a data signal output by the signal output circuit 1 is collected again, and whether the data signal is within the threshold range is determined; if YES, the fingerprint identification is performed according to the data signal collected at this time; and if NO, the current value of the constant current source A is increased again to further reduce the anode voltage V of the photodiode PIN. The reduced anode voltage V is input to the anode of the photodiode PIN again, a data signal output by the signal output circuit 1 is collected again, and whether the data signal is within the threshold value is determined. This process is circulated until the data signal output by the signal output circuit is within the threshold range.

Optionally, in the foregoing circuit for fingerprint identification provided by the embodiment of the present disclosure, as shown in FIG. 4 to FIG. 6, the step that when the voltage adjustment circuit 1 includes a second switching transistor T2 and a third switching transistor T3, the initial voltage $V_0$ is loaded to the anode of the photodiode PIN through the voltage adjustment circuit 1 may include that:

switching off the second switching transistor T2, switching on the third switching transistor T3, and loading the initial voltage $V_0$ to the anode of the photodiode PIN through a third power terminal VD.

Optionally, as shown in FIG. 4 to FIG. 6, the initial voltage $V_0$ loaded to the anode of the photodiode PIN through the third power terminal VD is a voltage value that may perform the fingerprint identification under the relatively weak external light or in the room.

Optionally, in the foregoing circuit for fingerprint identification provided by the embodiment of the present disclosure, as shown in FIG. 4 to FIG. 6, the step that the anode voltage input to the photodiode PIN is adjusted through the voltage adjustment circuit 1 may include that:

switching off the third switching transistor T3, switching on the second switching transistor T2;

loading the set current value $I_A$ to the constant current source A;

loading a first voltage V to the anode of the photodiode PIN through the second electrode of the first transistor T1, wherein the first voltage V is less than the initial voltage $V_0$, and optionally, the anode voltage is adjusted according to the above adjustment process and may enable the photodiode PIN to work in the linear region;

collecting a data signal output by the signal output circuit again;

determining whether the data signal is within the threshold range; and adjusting the set current value of the constant current source until the data signal output by the signal output circuit is within the threshold range. The determination and collection processes refer to the illustration of determination and collection of the structure shown in FIG. 3 in the above driving method, and repeated content is not described here.

The principle of the fingerprint identification performed under the strong ambient light and the relatively weak external light or in the room of the embodiments of the present disclosure is described in detail below respectively by the fingerprint identification circuit shown in FIG. 6. A circuit timing sequence diagram of the fingerprint identification performed under the relatively weak external light or in the room is as shown in FIG. 8, and a circuit timing sequence diagram of the fingerprint identification performed under the strong ambient light is as shown in FIG. 9.

Figure 8:
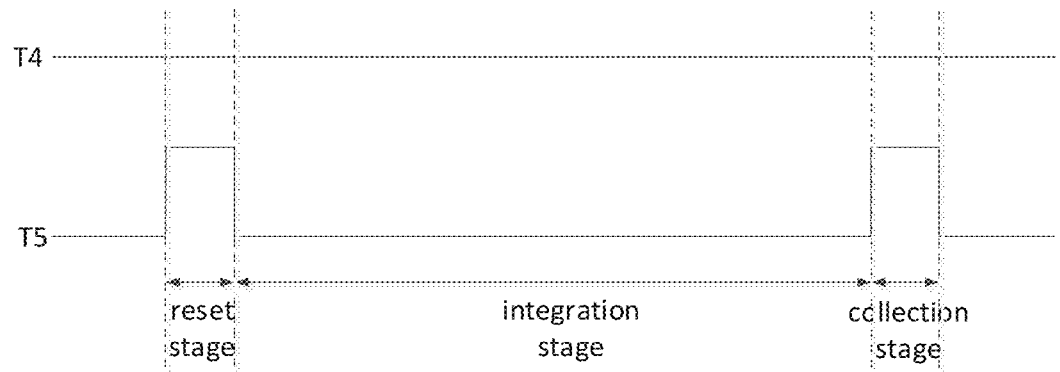
FIG. 8 is a circuit timing sequence schematic diagram of the circuit for fingerprint identification shown in FIG. 6.
Figure 9:
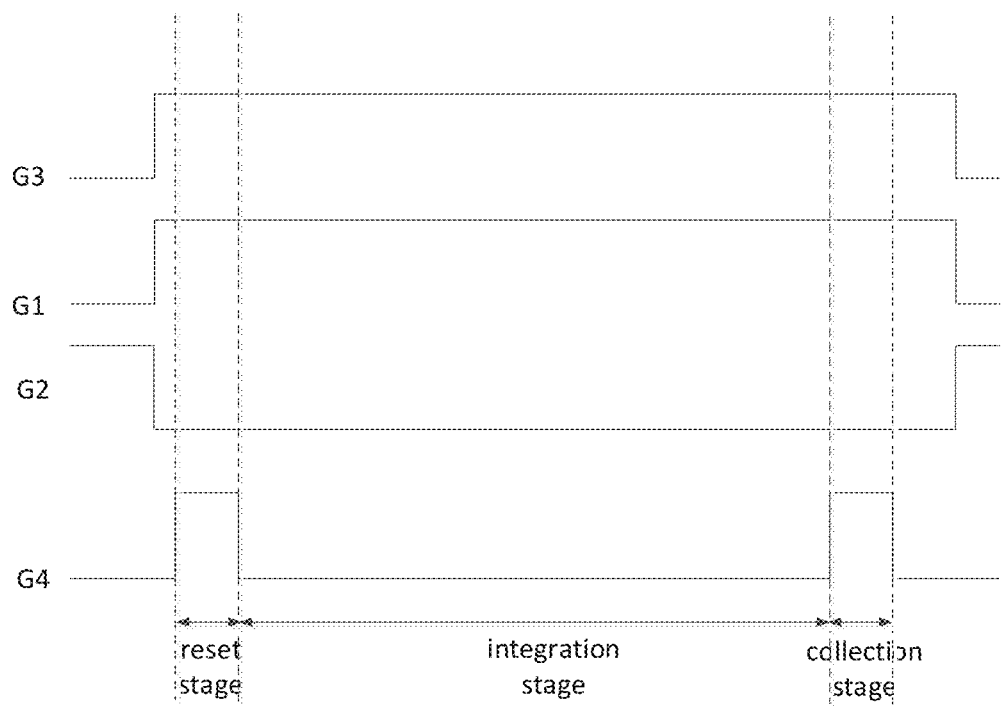
FIG. 9 is another circuit timing sequence schematic diagram of the circuit for fingerprint identification shown in FIG. 6.

Optionally, during the fingerprint identification performed under the relatively weak external light or in the room, as shown in FIG. 6 and FIG. 8, a reset stage, an integration state, and a collection stage are included.

At the reset stage: the fifth switching transistor T5 is switched on under the control of the fourth control signal terminal G4, a signal of the reference voltage terminal Vref is input to the cathode of the photodiode PIN through the amplifier U, and the cathode voltage is provided for the cathode of the photodiode PIN; the second switching transistor T2 is switched off under the control of the first control signal terminal G1, the third switching transistor T3 is switched on under the control of the second control signal terminal G2, and the anode voltage that may enable the photodiode PIN to work in the linear region is input to the anode of the photodiode PIN through the third power terminal VD.

At the integration stage: the fifth switching transistor T5 is switched off under the control of the fourth control signal terminal G4. At this stage, the fifth switching transistor T5 is in an off state to accumulate a current signal of light in the photodiode PIN, so that a relatively strong light current signal is input into a storage capacitor to improve the accuracy of fingerprint identification.

At the collection stage: the fifth switching transistor T5 is switched on under the control of the fourth control signal terminal G4, the light current signal accumulated in the photodiode PIN is input into the storage capacitor C, then amplified through the amplifier U, and output through the signal output terminal Vout, so as to perform the fingerprint identification.

During the fingerprint identification performed under the strong ambient light, as shown in FIG. 6 and FIG. 9, a reset stage, an integration state, and a collection stage are included:

At the reset stage: the third switching transistor T3 is switched off under the control of the second control signal terminal G2; the second switching transistor T2 is switched on under the control of the first control signal terminal G1; the fourth switching transistor T4 is switched on under the control of the third control terminal G3; the adjusted anode voltage (the adjustment process of the anode voltage specifically refers to the illustrations in the above fingerprint identification circuit and the driving method) that may enable the photodiode PIN to work in the linear region is input to the anode of the photodiode PIN through the second switching transistor T2 under the control of the fourth control signal terminal G4; the fifth switching transistor T5 is switched on; the signal of the reference voltage terminal Vref is input to the cathode of the photodiode PIN through the amplifier U; and the cathode voltage is provided for the cathode of the photodiode PIN.

At the integration stage: the fifth switching transistor T5 is switched off under the control of the fourth control signal terminal G4. At this stage, the fifth switching transistor T5 is in an off state to accumulate a current signal of light in the photodiode PIN, so that a relatively strong light current signal is input into a storage capacitor to improve the accuracy of fingerprint identification.

At the collection stage: the fifth switching transistor T5 is switched on under the control of the fourth control signal terminal G4, the light current signal accumulated in the photodiode PIN is input into the storage capacitor C, then amplified through the amplifier U, and output through the signal output terminal Vout, so as to perform the fingerprint identification.

Based on the same inventive concept, the embodiment of the present disclosure further provides a display panel, including: any one of the foregoing circuits for fingerprint identification provided by the embodiments of the present disclosure. The principle of the display panel for solving problems is similar to that of the above fingerprint identification circuit, so that the implementation of the display panel may refer to the implementation of the above fingerprint identification circuit, and repeated content is not described here.

It should be noted that the above display panel includes a plurality of arrayed pixel units. Each pixel unit includes any one of the above circuits for fingerprint identification provided by the embodiments of the present disclosure.

Based on the same inventive concept, the embodiment of the present disclosure further provides a display device, including the above display panel provided by the embodiment of the present disclosure. The display device may be: any product or component having a display function, such as a mobile phone, a tablet computer, a television, a display, a notebook computer, a digital photo frame and a navigator. Other indispensable components of the display device are all understood by those skilled in the art, and are not described herein and should not be construed as limiting the present disclosure. The implementation of the display device may refer to the embodiment of the above fingerprint identification circuit, and repeated content is not described here.

The circuit for fingerprint identification and the driving method thereof, the display panel, and the display device, which are provided by the embodiments of the present disclosure, include: the voltage adjustment circuit, the photodiode, and the signal output circuit. The voltage adjustment circuit is electrically connected with the anode of the photodiode, and the signal output circuit is electrically connected with the cathode of the photodiode. The voltage adjustment circuit is configured to adjust the anode voltage input to the photodiode to enable the photodiode to work in the linear region. The signal output circuit is configured to amplify and output the signal output by the photodiode. The circuit for fingerprint identification of the present disclosure can adjust the anode voltage input to the photodiode through the added voltage adjustment circuit to enable the photodiode to work in the linear region. For example, in case of relatively strong external light, the photodiode is in a saturated state. At this time, the anode voltage input to the photodiode is adjusted through the voltage adjustment circuit to enable the photodiode to work in the linear region. In this way, the linear region range of the photodiode can be enlarged. That is, the photodiode working area is changed from a saturated region to the linear region to have a larger dynamic range, thereby realizing valid fingerprint identification under strong ambient light.

Obviously, those skilled in the art can make various changes and modifications to the present disclosure without departing from the spirit and scope of the present disclosure. Therefore, if these changes and transformations of the present disclosure fall within the scope of the claims of the present disclosure and equivalent technologies of the present disclosure, the present disclosure is intended to include these changes and transformations.

What is claimed is:

1. A circuit for fingerprint identification, comprising:
   a voltage adjustment circuit,
   a photodiode, and
   a signal output circuit;
   wherein
      the voltage adjustment circuit is electrically connected with an anode of the photodiode, and the signal output circuit is electrically connected with a cathode of the photodiode;
      the voltage adjustment circuit is configured to adjust an anode voltage input to the photodiode to enable the photodiode to work in a linear region; and
      the signal output circuit is configured to amplify and output a signal output by the photodiode;
      wherein the voltage adjustment circuit comprises:
         a first transistor, and
         a constant current source;
         wherein
            the first transistor works in an amplifier region;
            a current value of the constant current source is adjustable;
            a gate of the first transistor is connected with a reset signal terminal; a first electrode of the first transistor is connected with a first power terminal; a second electrode of the first transistor is connected with a first end of the constant current source and the anode of the photodiode; and
            a second end of the constant current source is connected with a second power terminal.

2. The circuit for fingerprint identification according to claim 1, wherein the voltage adjustment circuit further comprises:
   a second switching transistor, and
   a third switching transistor;
   wherein
      a gate of the second switching transistor is connected with a first control signal terminal; a first electrode of the second switching transistor is connected between the first end of the constant current source and the second electrode of the first transistor; a second electrode of the second switching transistor is connected with the anode of the photodiode; and a gate of the third switching transistor is connected with a second control signal terminal; a first electrode of the third switching transistor is connected with a third power terminal; and a second electrode of the third switching transistor is connected with the anode of the photodiode.

3. The circuit for fingerprint identification according to claim 2, wherein the voltage adjustment circuit further comprises:
   a fourth switching transistor; wherein
      a gate of the fourth switching transistor is connected with a third control signal terminal;
      a first electrode of the fourth switching transistor is connected with the reset signal terminal; and
      a second electrode of the fourth switching transistor is connected with the gate of the first transistor.

4. The circuit for fingerprint identification according to claim 3, wherein the first control signal terminal and the third control signal terminal are a same signal terminal.

5. The circuit for fingerprint identification according to claim 1, wherein the signal output circuit further comprises:
   a fifth switching transistor,
   an amplifier, and
   a capacitor;
   wherein
      a gate of the fifth switching transistor is connected with a fourth control signal terminal; a first electrode of the fifth switching transistor is connected with the cathode of the photodiode; a second electrode of the fifth switching transistor is connected with a negative input terminal of the amplifier; a positive input terminal of the amplifier is connected with a reference voltage terminal; and the capacitor is connected between the negative input terminal of the amplifier and the output terminal of the amplifier.

6. A driving method of the circuit for fingerprint identification according to claim 1, comprising:
   loading an initial voltage to the anode of the photodiode through the voltage adjustment circuit, during fingerprint identification;
   reading a data signal output by the signal output circuit according to the initial voltage;
   comparing the data signal output by the signal output circuit with a pre-stored threshold range; and
   determining whether the data signal output by the signal output circuit is within the threshold range;
   if YES, performing the fingerprint identification directly according to the data signal output by the signal output circuit; and
   if NO, adjusting the anode voltage input to the photodiode through the voltage adjustment circuit to enable the photodiode to work in the linear region, and performing the fingerprint identification on a output data signal collected by the photodiode, when the photodiode works in the linear region.

7. The driving method according to claim 6, wherein the loading the initial voltage to the anode of the photodiode through the voltage adjustment circuit, comprises:
   loading an initial current value to the constant current source; and
   loading the initial voltage to the anode of the photodiode through the second electrode of the first transistor.

8. The driving method according to claim 7, wherein the adjusting the anode voltage input to the photodiode through the voltage adjustment circuit comprises:
   on the basis of the initial current value, increasing the current value of the constant current source to reduce the anode voltage of the photodiode;
   collecting a data signal output by the signal output circuit;
   determining whether the data signal is within the threshold range, and
   adjusting the current value of the constant current source until the data signal output by the signal output circuit is within the threshold range.

9. The driving method according to claim 6, wherein when the voltage adjustment circuit further comprises a second switching transistor and a third switching transistor, the loading the initial voltage to the anode of the photodiode through the voltage adjustment circuit comprises:
   switching off the second switching transistor, switching on the third switching transistor, and
   loading the initial voltage to the anode of the photodiode through a third power terminal.

10. The driving method according to claim 9, wherein the adjusting the anode voltage input to the photodiode through the voltage adjustment circuit comprises:
    switching off the third switching transistor, switching on the second switching transistor;
    loading a set current value to the constant current source;
    loading a first voltage to the anode of the photodiode through the second electrode of the first transistor, wherein the first voltage is less than the initial voltage;
    collecting a data signal output by the signal output circuit;
    determining whether the data signal is within the threshold range; and
    adjusting the set current value of the constant current source until the data signal output by the signal output circuit is within the threshold range.

11. A display device, comprising a display panel, wherein the display panel comprises a circuit for fingerprint identification, the circuit for fingerprint identification comprises:
    a voltage adjustment circuit,
    a photodiode, and
    a signal output circuit;
    wherein
       the voltage adjustment circuit is electrically connected with an anode of the photodiode, and the signal output circuit is electrically connected with a cathode of the photodiode;
       the voltage adjustment circuit is configured to adjust an anode voltage input to the photodiode to enable the photodiode to work in a linear region; and
       the signal output circuit is configured to amplify and output a signal output by the photodiode;
    wherein the voltage adjustment circuit comprises:
       a first transistor, and
       a constant current source;
       wherein
          the first transistor works in an amplifier region;
          a current value of the constant current source is adjustable;
          a gate of the first transistor is connected with a reset signal terminal; a first electrode of the first transistor is connected with a first power terminal; a second electrode of the first transistor is connected with a first end of the constant current source and the anode of the photodiode; and
          a second end of the constant current source is connected with a second power terminal.

12. The display device according to claim 11, wherein the voltage adjustment circuit further comprises:

a second switching transistor, and
a third switching transistor;
wherein
- a gate of the second switching transistor is connected with a first control signal terminal; a first electrode of the second switching transistor is connected between the first end of the constant current source and the second electrode of the first transistor; a second electrode of the second switching transistor is connected with the anode of the photodiode; and
- a gate of the third switching transistor is connected with a second control signal terminal; a first electrode of the third switching transistor is connected with a third power terminal; and a second electrode of the third switching transistor is connected with the anode of the photodiode.

13. The display device according to claim 12, wherein the voltage adjustment circuit further comprises:
a fourth switching transistor; wherein
- a gate of the fourth switching transistor is connected with a third control signal terminal;
- a first electrode of the fourth switching transistor is connected with the reset signal terminal; and
- a second electrode of the fourth switching transistor is connected with the gate of the first transistor.

14. The display device according to claim 13, wherein the first control signal terminal and the third control signal terminal are a same signal terminal.

15. The display device according to claim 11, wherein the signal output circuit comprises:
a fifth switching transistor,
an amplifier, and
a capacitor;
wherein
- a gate of the fifth switching transistor is connected with a fourth control signal terminal; a first electrode of the fifth switching transistor is connected with the cathode of the photodiode; a second electrode of the fifth switching transistor is connected with a negative input terminal of the amplifier; a positive input terminal of the amplifier is connected with a reference voltage terminal; and the capacitor is connected between the negative input terminal of the amplifier and the output terminal of the amplifier.

* * * * *